United States Patent
Kapur et al.

(10) Patent No.: US 6,453,437 B1
(45) Date of Patent: Sep. 17, 2002

(54) METHOD AND SYSTEM FOR PERFORMING TRANSITION FAULT SIMULATION ALONG LONG CIRCUIT PATHS FOR HIGH-QUALITY AUTOMATIC TEST PATTERN GENERATION

(75) Inventors: Rohit Kapur, Cupertino, CA (US); Thomas W. Williams, Boulder, CO (US); John Waicukauski, Tualatin, OR (US); Peter Wohl, Willistion, VT (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 09/348,712

(22) Filed: Jul. 1, 1999

(51) Int. Cl.$^7$ .............................................. G01R 31/28
(52) U.S. Cl. ..................................................... 714/741
(58) Field of Search ............................... 714/726, 738; 365/201

(56) References Cited

U.S. PATENT DOCUMENTS 5,546,408 A * 8/1996 Keller ......................... 714/738
6,148,425 A * 11/2000 Bhawmik et al. ........... 714/726
6,223,314 B1 * 4/2001 Arabi et al. ................. 714/726

OTHER PUBLICATIONS

Krstic et al., Identification and test generation for primitive faults, IEEE, pp. 423–432, 1996.*
Pomeranz et al., Design for testability for path delay faults in large combinational circuits using test–points, IEEE, pp. 1–7. 1994.*
Sangwine, Diagnosis of multiple faults in combinational digital circuits by modelling of transition propagation along critical paths IEEE, pp. 594–606, Oct. 1992.*
Majhi et al. On test coverage of path delay faults, IEEE, pp. 418–421, Jan. 1996.*
Majhi et al. An efficient automatic test pattern genration system for path delay faults in combinational circuits, IEEE, pp. 161–165, Jan. 1995.*

* cited by examiner

Primary Examiner—Albert Decady
Assistant Examiner—Shelly A Chase
(74) Attorney, Agent, or Firm—Wagner Murabito & Hao LLP

(57) ABSTRACT

A method for generating a test pattern for use in testing an integrated circuit device. The computer implemented steps of receiving and storing the netlist specification in a computer memory unit, and simulating the netlist using the computer implemented synthesis system. Using the netlist simulation, a set of circuit paths for each fault of the plurality of faults within the netlist specification is determined. From this set of paths, respective longest paths for each fault is determined. Using an ATPG (automatic test pattern generation) process, a test vector is determined for the first fault. Transition fault simulation is then performed on the first fault by applying the test vector to a first path through the first fault, wherein the first path is the longest path traversing through the first fault as determined by the ATPG process. Responsive to the transition fault simulation, a second fault that is fortuitously detected by the test vector as applied to a second path traversing through the second fault is identified. The test vector is credited with detecting the first fault, and, provided the second path is the longest path that traverses through the second fault, the test vector is credited with detecting the second fault. If the second path is not the longest path, a test vector is generated in a subsequent iteration of the method. In so doing, the method ensures transition faults are detected along long paths as opposed to short paths, thereby improving test quality.

15 Claims, 12 Drawing Sheets

1200

```
STORE A NETLIST FOR AN INTEGRATED CIRCUIT WITHIN THE
MEMORY OF A CAD WORKSTATION
1201
         │
         ▼
PERFORM FORWARD LEVELIZATION TO QUANTIFY THE FAN OUT
DELAY OF THE PATHS FOR THE NETLIST
1202
         │
         ▼
PERFORM BACKWARD LEVELIZATION TO QUANTIFY THE FAN IN
DELAY OF THE CIRCUIT PATHS FOR THE NETLIST
1203
         │
         ▼
STORE THE RESULTING DELAY INFORMATION (E.G., LEVEL
INFORMATION) FOR ALL OF THE CIRCUIT PATHS IN THE
NETLIST SUCH THAT THE DELAY INFORMATION IS AVAILABLE
FOR ATPG.
1204
         │
         ▼
USING ATPG, DETERMINE A TEST VECTOR FOR A FIRST FAULT
IN THE NETLIST USING THE LONGEST CIRCUIT PATH FOR THAT
FAULT
1205
         │
         ▼
PERFORM FAULT SIMULATION FO THE TEST VECTOR TO
DETERMINE THE LIST OF FORTUITOUSLY DETECTED FAULTS
1206
         │
         ▼
        (A)
```

METHOD AND SYSTEM FOR PERFORMING TRANSITION FAULT SIMULATION ALONG LONG CIRCUIT PATHS FOR HIGH-QUALITY AUTOMATIC TEST PATTERN GENERATION

FIELD OF THE INVENTION

The field of the present invention pertains to the testing of integrated circuits. More particularly, the present invention pertains to a method and system for efficiently generating test vectors for use with automated testing equipment (ATE) for testing integrated circuits to detect faults therein.

BACKGROUND OF THE INVENTION

Computer systems, software applications, and the devices and processes built around them are continually growing in power and complexity. Typically, the more powerful and complex the system, the greater its utility and usefulness. However, as these computer and software implemented systems and processes become more powerful, detecting and correcting flaws within the systems becomes increasingly difficult.

Prior art FIG. 1 shows a diagram of a basic design synthesis process. As depicted in FIG. 1, an HDL (hardware description language) netlist 101, synthesis process 102, and a completed integrated circuit device 103 are shown. As is well known by those skilled in the art, HDL representations (e.g., represented one or more levels of abstraction) are used by engineers to model the expected behavior and functionality of a desired device. Once the HDL representation is "verified", it is processed by an HDL compiler program to produce HDL netlist 101, which comprises a detailed list of logic components and the interconnections between these components for implementing the behavior and functionality. HDL netlist 101 then undergoes computer aided design synthesis process 102, wherein the components comprising HDL netlist 101 are mapped to specific technology libraries to convert the technology independent logical representation (HDL netlist 101) into standard circuits and other required information for fabrication of the resulting device. As depicted in FIG. 1, the result of CAD synthesis process 102 is the completed integrated circuit device 103.

Prior art FIG. 2 shows two diagrams of commonly encountered manufacturing defects within fabricated integrated circuit devices. Diagram 201 shows a "short" defect between a first line 210 and a second line 211. A short defect occurs when, for example, a contaminant particle (e.g., dust, etc.) causes extraneous metal deposit 215 to occur across lines 210 and 211. Metal deposit 215 thus electrically shorts lines 210 and 211, disrupting the functionality that depends upon these two lines. Diagram 202 shows an "open" defect between line 210 and 211. And open defect occurs when, for example, a contaminant particle causes and inadvertent discontinuity 220 during the deposition of one or more metal lines. Discontinuity 220 disrupts the functionality that depends upon line 210.

Thus, any integrated circuit devices including defects such as shorts or opens shown in diagrams 201 and 202 are most likely defective, and must be caught before the devices are shipped to customers. Very sophisticated test programs, automatic test pattern generation (ATPG) programs, are used to analyze the various netlist representative of the integrated circuit designs (e.g., HDL netlist 101) and generate therefrom the test patterns (e.g., also referred to as test programs or test vectors) used for testing the devices with automated test equipment (ATE) systems.

The ATPG process is designed to facilitate the detection of defective integrated circuit devices. An integrated circuit device is defective if it includes one or more defects, or flaws within its internal circuitry, which interfere with its proper functionality. The most advanced manufacturing processes produce large numbers of defective devices along with nominal devices. A typical yield for an advanced manufacturing process is, for example, 70 percent, wherein 70 percent of the fabricated devices are nominal and 30 percent of them are defective. The goal of ATPG is to create test vectors for use with ATE systems which will always identify a defective device. The test vectors thereby ensure end product quality, wherein the only devices which are shipped to customers are the nominally performing, defect free integrated circuit devices.

Unfortunately, circuit level defects like shorts and opens are very difficult to generate tests for, even with the most sophisticated ATPG programs. In automatic test program generation analysis, it is extremely difficult to deterministically analyze a netlist representation with sufficient detail to detect individual shorts or opens on individual circuits. Modern devices typically include many millions of individual circuit elements (e.g., transistors, interconnects, etc.). At this lowest level, large modern devices cannot be efficiently analyzed via ATPG.

Thus, for efficiency reasons, ATPG is mostly done at the gate level (AND gate, OR gate, etc.) and higher. In most devices, each gate is typically implemented using 4 to 5 transistors. The problem is that the higher the level at which ATPG is done, the further away from the actual circuit level defect (e.g., defect 215 and 220) the testing is being performed. Because of this, even though a defect may be a simple short or open, at the higher levels of testing, the defect may manifest itself differently, often in subtle, hard to detect ways. Hence, ATPG at higher levels (e.g., gate level and above) involves modeling the behavior of the defects as manifested at the higher level, and then generating tests designed to detect the specific manifestation of that behavior.

To perform ATPG, the ATPG program tests for "faults" which are models of defects. The ATPG program models the behavior of certain faults and then tests for the occurrence of that behavior. The faults are designed to abstract the physical manifestation of the real defects. The faults should match the behavior and manifestation of the real defects at the end, when a particular finished device is actually tested.

There are many different types of defect fault models, fault and fault model in use in ATPG processing. "Stuck-at" faults are the most commonly used. Stuck-at faults match a certain set of real defects which occur in fabricated integrated circuit devices. As is well known, stuck-at faults consider lines between gates to be "stuck at" logical zero "0" or logical one "1" (e.g., short to Add or Gnd). Stuck-at fault Tests detect those defects which manifest themselves as interconnect lines being always at one or zero regardless of the overall state of the device.

There is a problem, however, in that stuck-at faults do not match all defects, hence test patterns devised for them do not catch all defective devices. To catch more of the remaining defects, other alternative fault models are also used in addition to stuck-at faults. The most commonly used alternative fault model is typically the "transition" fault model. Transition faults are similar to stuck-at faults, however, instead of being stuck at logical zero or logical one, a defective line is slow to rise or slow to fall to logical one or zero. Thus adding a temporal aspect to the fault model.

Transition faults add a timing aspect to the stuck-at fault model. For example, the timing aspect of transition faults detects slow-to-rise and slow-to-fall defects wherein the line is not stuck at for example zero, but rises to logical one too slowly, causing a signal failure. Whereas stuck-at faults assume a line is fixed at a certain level (one or zero), transition faults test for and are capable of finding slow-to-rise and slow-to-fall defects because of the timing aspects.

Even with the use of both stuck-at faults and transition faults, prior art ATPG does not catch all defective devices. Because of the timing aspect differences, stuck-at faults and transition faults are not easily combined within typical prior art ATPG tools. The heuristics used to determine test patterns for stuck-at faults are non-optimal for the test patterns of transition faults. Because of this, the quality of testing suffers, the testing process itself is less efficient, and the likelihood of defective devices being shipped to customers and being incorporated into customer-end systems is unacceptably high.

In the past, ATPG processes generated test vectors for stuck-at faults which do not have any timing associated with them. For instance, they remain stuck at "1" or stuck at "0" indefinitely. Transition faults on the other hand are faults that cause the signals to be slow to rise or slow to fall. Because stuck at faults have no timing aspect to them, the test generation processes are programmed to use the easiest path, e.g., the shortest path.

However, for transition faults, the shortest path approach results in a poor quality test vector because it takes a much bigger timing defect to impact the quality of the integrated circuit when tested along the short path. Therefore, use of the short path approach yields poor test vector quality for detection of transition faults.

Accordingly, what is needed is a test vector generation method that can generate high quality test vectors for detecting transition faults along long paths.

SUMMARY OF THE INVENTION

The present invention provides an ATPG process optimized to use transition fault testing on long circuit paths to generate much higher quality test vectors than the prior art. In addition, the present invention provides an ATPG process capable of using transition fault analysis more efficiently than the prior art to identify a larger percentage of defects.

In one embodiment, the present invention is implemented as an ATPG process within a CAD synthesis system (e.g., a running on a workstation). The ATPG process of the present invention is designed to generate test patterns for use in integrated circuit device testing with ATE, and is designed to take advantage of the fact that fault testing using longer circuit paths is of much higher quality than fault testing using shorter circuit paths. This is the case because the device does not reach a quiescent state until the signals have propagated through the longest paths. The ATPG process includes the computer implemented steps of receiving a netlist specification representing a design to be realized in physical form, storing the netlist specification in memory, and simulating the netlist using the computer workstation. Using the netlist simulation, a set of circuit paths is determined along which a first fault can be detected. Each of the circuit paths in the set passes through the fault site of the first fault.

ATPG processing is then performed to determine a test vector along the longest possible circuit path for the first fault. During fault simulation of the test vector created for the first fault, it is possible that another fault, called a second fault, is fortuitously detected as a result of the fault simulation operation. The path along which the second fault was detected may not be the longest path through the second fault. Every fault is associated with a set of circuit paths along which it can be detected. Thus the second fault has a set of paths of varying path lengths associated with it (each passing through the fault site of the second fault). During fault simulation of the second fault, the length of the detection path is recorded. If the second fault is detected along the longest path, or within a certain specified tolerance of the longest path, the fault is "credited". Otherwise, ATPG processing continues until the second fault is in fact detected on a "longest" path. In so doing, the process ensures transition faults are detected along long circuit paths as opposed to short circuit paths, or randomly chosen paths, thereby improving test quality.

BRIEF DESCRIPTION OF THE DRAWINGS

The present invention is illustrated by way of example and not by way of limitation, in the figures of the accompanying drawings and in which like reference numerals refer to similar elements and in which:

Prior art

Prior art

FIG. 11A shows steps of a flow chart of an ATPG process in accordance with one embodiment of the present invention.

DETAILED DESCRIPTION OF THE INVENTION

Figure 1:
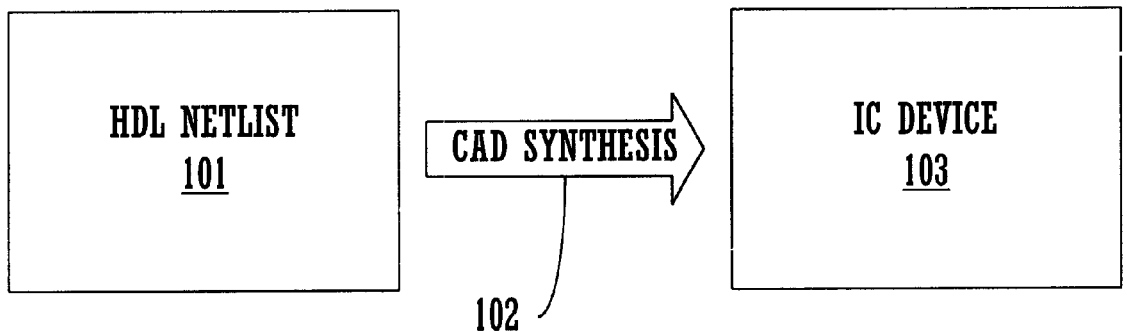
FIG. 1 shows a diagram of a basic design synthesis process.
Figure 2:
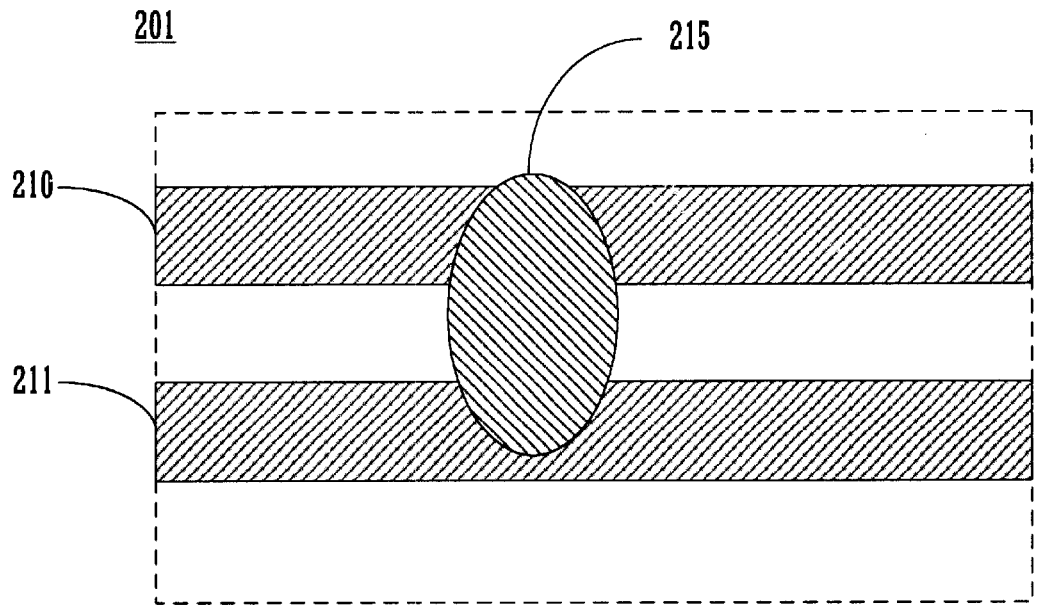
FIG. 2 shows two diagrams of commonly encountered manufacturing defects within fabricated integrated circuit devices.
Figure 2:
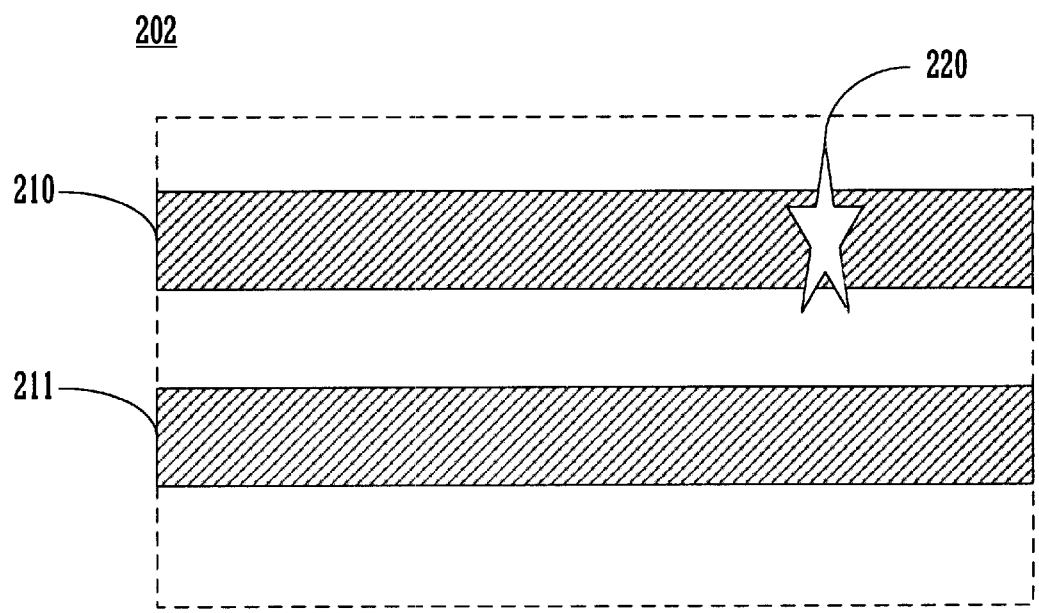

Reference will now be made in detail to the embodiments of the invention, a method and system for performing transition fault simulation along long circuit paths for high-quality ATPG, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to obscure aspects of the present invention unnecessarily.

The present invention provides a method and system for performing transition fault simulation along long circuit paths for high-quality ATPG. The present invention provides an ATPG process optimized to use transition fault testing on long circuit paths to generate much higher quality test vectors than the prior art. With respect transition faults, the short paths are the worst for quality because they have the most slack with respect to the other paths in an integrated circuit device. The device does not reach its quiescent state until the signals have propagated through the longest paths (typically the critical path). In accordance with present invention, the best path for testing the transition fault is the longest path as it is sensitive to the smallest delay defect. In so doing, the present invention provides an ATPG process capable of using transition faults analysis more efficiently than the prior art to catch a larger percentage of defects. The present invention and its benefits are further described below.

NOTATION AND NOMENCLATURE

Some portions of the detailed descriptions which follow are presented in terms of procedures, steps, logic blocks, processing, and other symbolic representations of operations on data bits within a computer memory. These descriptions and representations are the means used by those skilled in the data processing arts to convey most effectively the substance of their work to others skilled in the art. A procedure, computer executed step, logic block, process, etc., are here, and generally, conceived to be self-consistent sequences of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing," "computing," "translating," "instantiating," "determining," "displaying," "recognizing," or the like, refer to the action and processes of a computer system, or similar electronic computing device, that manipulates and transforms data represented as physical (electronic) quantities within the computer system's registers and memories into other data similarly represented as physical quantities within the computer system registers or memories or other such information storage, transmission, or display devices.

COMPUTER SYSTEM ENVIRONMENT

Figure 3:
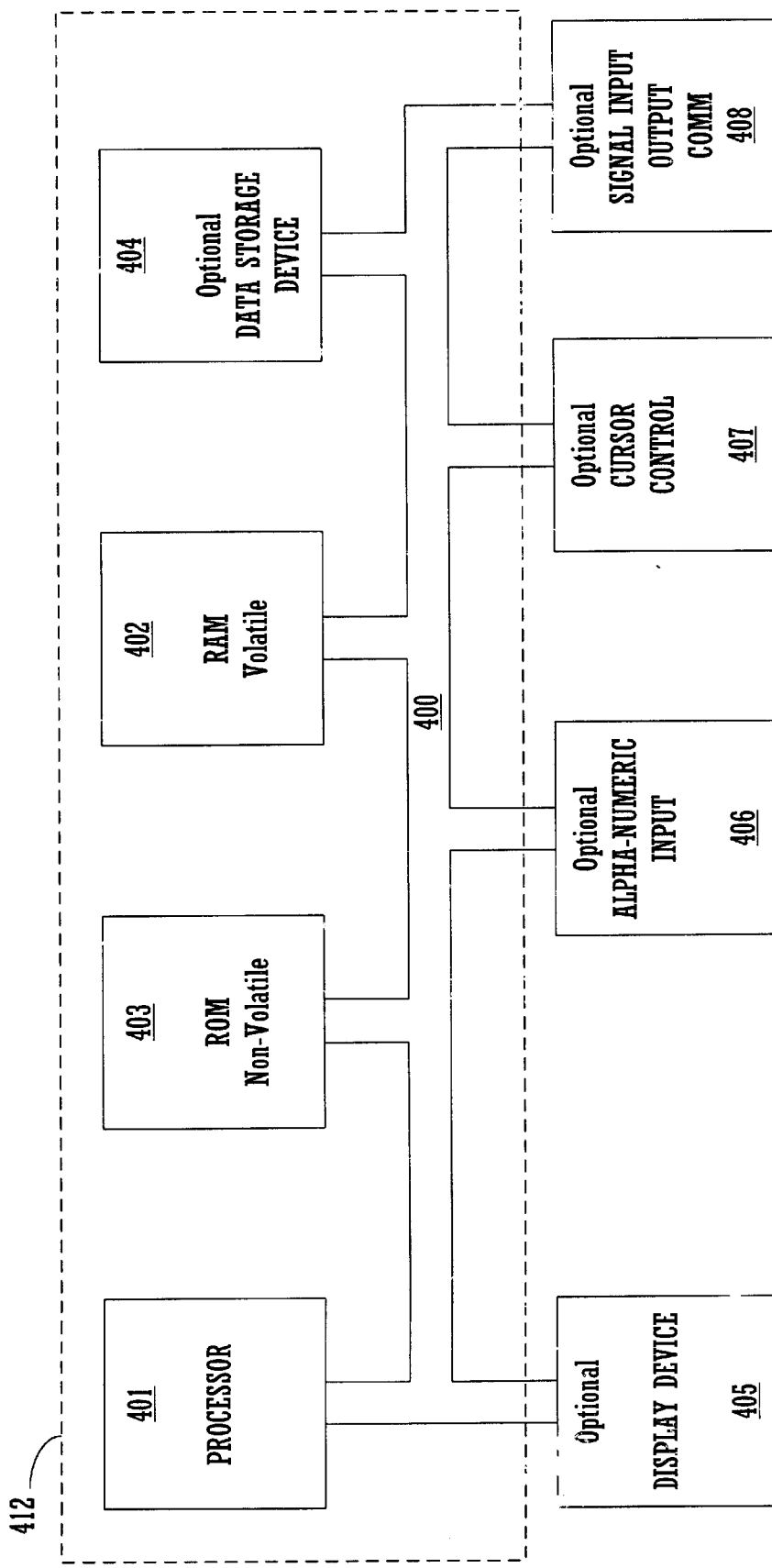
FIG. 3 shows a design synthesis CAD workstation in accordance with one embodiment of the present invention.

Referring to FIG. 3, a computer system 412 is illustrated. Within the following discussions of the present invention, certain processes and steps are discussed that are realized, in one embodiment, as a series of instructions (e.g., software program) that reside within computer readable memory units of system 412 and executed by processors of system 412. When executed, the instructions cause computer system 412 to perform specific actions and exhibit specific behavior which is described in detail to follow.

Specific aspects of the present invention are operable within a programmed computer aided design (CAD) system. A CAD system operable to implement the elements (e.g., a computer implemented synthesis system) of the present invention is shown in FIG. 3. In general, the CAD system of the present invention includes an address/data bus 400 for communicating information, one or more central processor(s) 401 coupled with bus 400 for processing information and instructions, a computer readable volatile memory unit 402 (e.g., random access memory, static RAM, dynamic RAM, etc.) coupled with bus 400 for storing information and instructions for the central processor(s) 401, a computer readable non-volatile memory unit 403 (e.g., read only memory, programmable ROM, flash memory, EPROM, EEPROM, etc.) coupled with bus 400 for storing static information and instructions for processor(s) 401. System 412 can optionally include a mass storage computer readable data storage device 404, such as a magnetic or optical disk and disk drive coupled with bus 400 for storing information and instructions. Optionally, system 412 can also include a display device 405 coupled to bus 400 for displaying information to the computer user, an alphanumeric input device 406 including alphanumeric and function keys coupled to bus 400 for communicating information and command selections to central processor(s) 401, a cursor control device 407 coupled to bus for communicating user input information and command selections to the central processor(s) 401, and a signal input/output device 408 coupled to the bus 400 for communicating messages, command selections, data, etc., to and from processor(s) 401.

Program instructions executed by the CAD system can be stored in RAM 402, ROM 403, or the storage device 404 and, when executed in a group, can be referred to as logic blocks or procedures. It is appreciated that data produced at the various logic synthesis stages of the present invention, including representations of the different levels of abstraction of the integrated circuit design (e.g., netlist, circuit descriptors, etc.), can also be stored in RAM 402, ROM 403, or the storage device 404 as shown in FIG. 3.

The display device 405 of FIG. 3 utilized with the computer system 412 of the present invention may be a liquid crystal device, cathode ray tube, or other display device suitable for creating graphic images and alphanumeric characters recognizable to the user. The cursor control device 407 allows the computer user to signal dynamically the two dimensional movement of a visible pointer on a display screen of the display device 405. Many implementations of the cursor control device are known in the art including a trackball, mouse, joystick, or special keys on the alphanumeric input device 405 capable of signaling movement of a given direction or manner of displacement.

Figure 4:
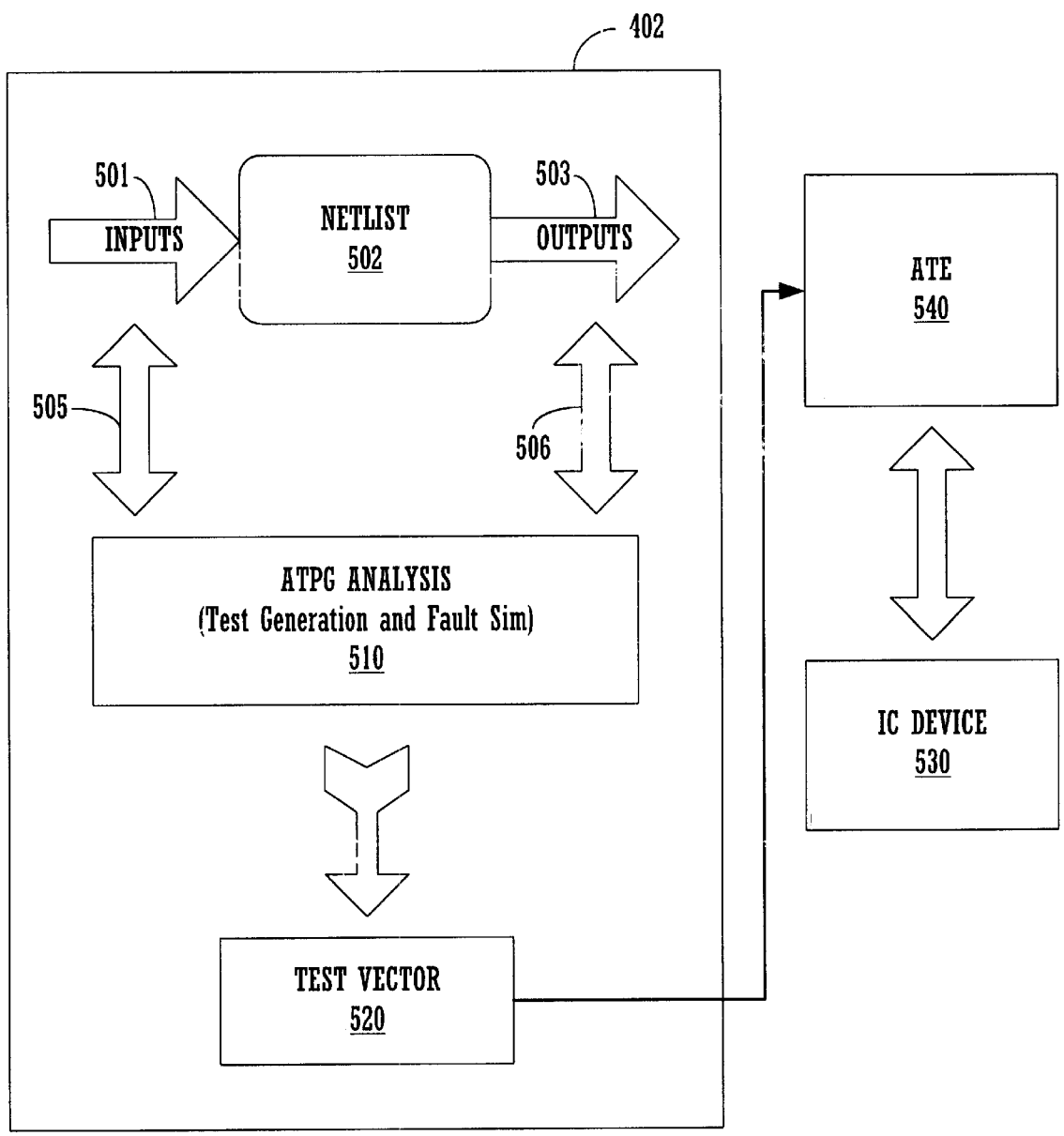
FIG. 4 shows an overview diagram ATPG analysis system in accordance with one embodiment of the present invention.

Referring now to FIG. 4, an overview diagram of an ATPG analysis system in accordance with one embodiment of present invention is shown. As depicted in FIG. 4, the ATPG analysis system of the present invention is instantiated within RAM 402 of CAD system 412. Instantiated within the RAM 402 is a netlist 502 and an ATPG analysis program 510. When simulated by a simulator process, netlist 502 can be referred to herein as a "netlist simulation" 502. Netlist 502 is a circuit description that models the functionality of an integrated circuit device 530. Netlist 502 is a logical model, or description, of the logic elements and their interconnections that comprise the functionality of the integrated circuit device 530. CAD system 412 uses "netlist simulation" 502 to simulate the functionality, the interaction, and the characteristics of the various elements comprising integrated circuit device 530.

ATPG analysis program 510 determines whether the performance and output of the design specified by netlist simulation 502 is accurate and within expected tolerances. Netlist simulation 502 is stimulated by inputs 501. Inputs 501 are operated on by netlist simulation 502, thereby generating outputs 503. As described above, test vectors are scanned into netlist simulation 502 and resulting captured data is scanned out of netlist simulation 502 via scan chains. This interaction is represented in FIG. 4 as lines 505 and 506.

The ATPG analysis program 510 interacts with netlist simulation 502 by providing stimulus and observing the outputs in order to determine the correct test vectors. The output of ATPG analysis 510 is a sequence of test vectors 520 for use with automated test equipment 540, which are applied to integrated circuit device 530 to detect the presence of specific one or more faults. The automated test equipment 540 uses a series of test vectors 520 to test the integrated circuit device 530, and thereby determine whether the integrated circuit device 530 is free from defects.

Referring still to FIG. 4, the goal of ATPG analysis 510 is to generate a set of test data (e.g., a series of test vectors and their associated information) for use with automated test equipment 540 which can ensure that any defective devices emerging from the fabrication process are caught prior to shipping to customers. Just like many other highly sophisticated manufacturing processes, the process of fabricating integrated circuit devices (e.g. integrated circuit device 530) is prone to errors. Integrated circuit devices produced as a result of these errors in the manufacturing process are defective. The "good" and "bad" integrated circuit devices produced are categorized according to the results of the testing process with automatic test equipment 540. Those integrated circuit devices categorized as being bad are disposed of, all those devices categorized as being good are shipped. The testing of integrated circuit devices as they emerge from fabrication processing is part of the typical manufacturing process. The quality of the end product is thus dependent upon the quality of the tests that are applied. The transition fault simulation method of the present invention as performed by ATPG analysis 510 is capable of efficiently providing higher-quality test data than the prior art.

Figure 5:
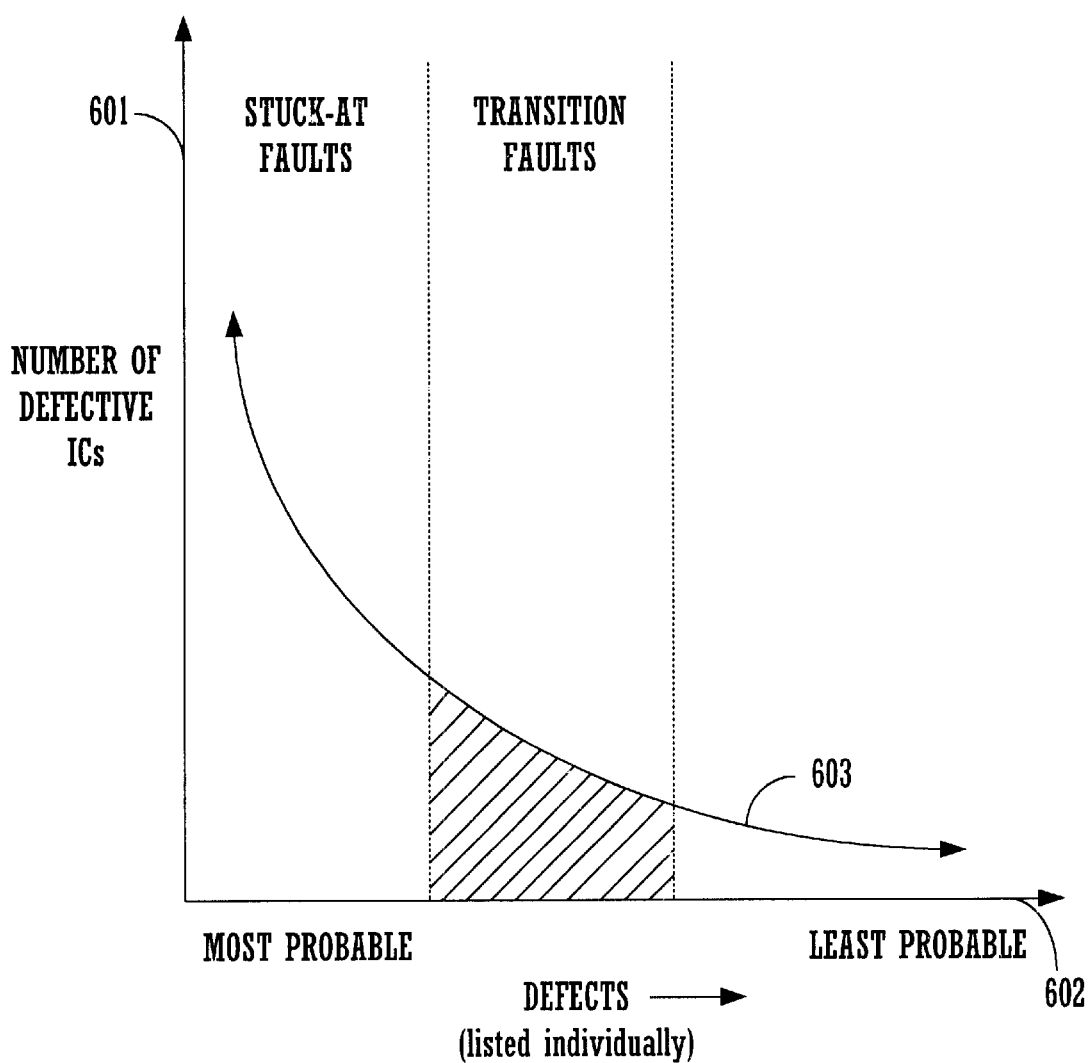
FIG. 5 shows a graph of an idealized relationship between the number of defects in a device and the characterization of those defects with regard to those being most probable and those being least probable.

Referring now to FIG. 5, a graph 600 showing an idealistic relationship between the number of defective devices and the defect type when categorized by the probability of occurrence of the defect. For a series of integrated circuit devices (e.g., integrated circuit device 530), the number of defective devices caused by a defect is shown on the vertical axis 601, and the range of categorization of those defects from most probable to least probable is shown on horizontal axis 602. Line 603 shows a characterization for a typical manufacturing process (e.g., integrated circuit 530).

Ideally, the first fault model selected should be the one that corresponds to the most probable defects. The next fault model selected should correspond to the next most probable defects not covered by the first fault model. Since testing is done with limited resources, the selection of the fault models and the number of them should be done judiciously with quality in mind. It should be noted that there is an emphasis on quality when a fault model is selected.

Although the depiction of graph 600 suggests that the faults selected directly map to the most probable defects, it should be noted that the relationship between faults and defects is often less than direct in the abstraction. If test generation for the faults is not through for the intent of the fault model another level of "fuzziness" is added to the relationship of faults and defects. The transition fault simulation along long circuit paths performed by ATPG analysis 510 eliminates much of this "fuzziness" by delivering high-quality test patterns.

Figure 6:
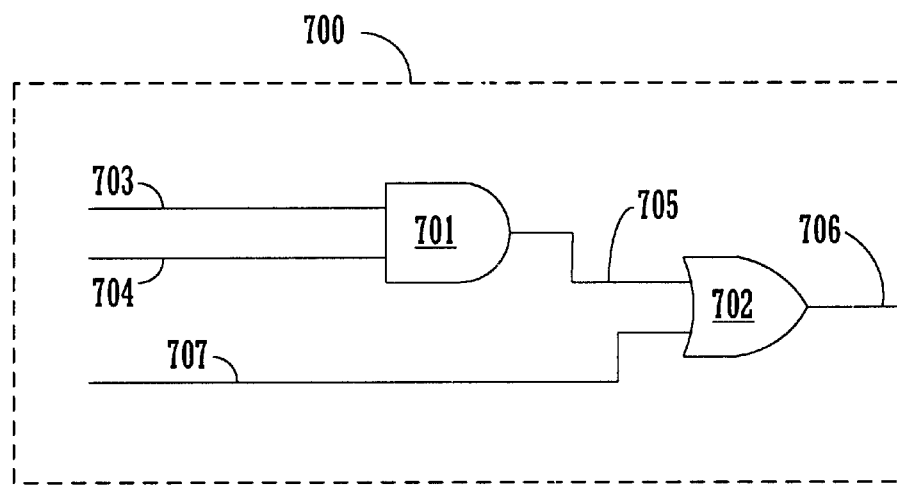
FIG. 6 shows a netlist portion and corresponding timing diagrams illustrating a slow-to-rise defect as detected by one embodiment of the present invention.
Figure 6:
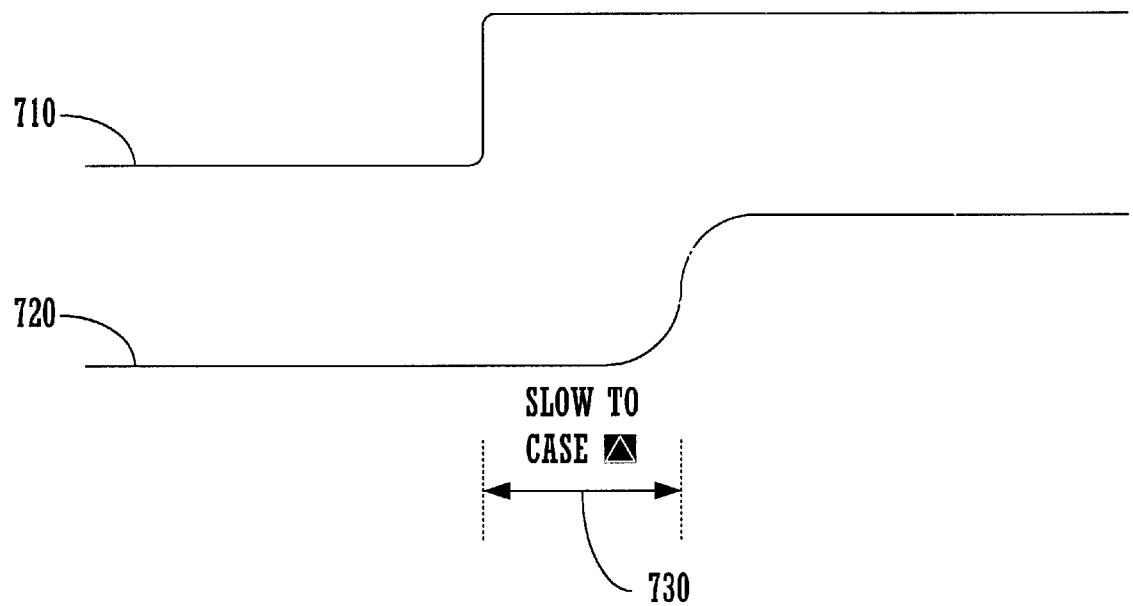

Referring now to FIG. 6, a netlist portion 700 and corresponding timing waveforms 710 and 720 are shown. Netlist portion 700 depicts a small portion of the overall netlist simulation 502 of FIG. 4. As depicted in FIG. 6, netlist portion 700 includes gate 701 (AND gate), gate 702 (OR gate), and their associated inputs and outputs 703–707. Waveforms 710 and 720 show the output characteristics of output 706. Waveforms 710 and 720 depict a slow-to-rise defect, as shown by the slow-to-rise Δ 730.

As described above, transition faults differ from stuck-at faults in that a particular interconnect line, in this case line 706, is not shorted or opened permanently to logical one or logical zero, but is merely slow to rise or slow-to-fall to logical one or logical zero. In netlist portion 700, output line 706 has a transition fault. Waveform 710 shows output 706 in a normal case, while waveform 720 shows output 706 when output 706 has a slow-to-rise defect. As shown by slow-to-rise Δ 730, the slow-to-rise defect causes a timing delay in the output signal of output line 706. This timing delay causes signals within device 530 to propagate more slowly, which in turn, affects the overall correct performance of the device.

Whereas stuck-at faults assume a line is fixed at a certain level (one or zero), transition faults test for and are capable of finding slow-to-rise and slow-to-fall faults because of the timing aspects. Accordingly, transition faults add a timing aspect to the stuck-at fault model. For example, the timing aspect of transition faults catches slow-to-rise and slow-to-fall defects wherein the line (e.g. output 706) is not stuck at for example zero, but rises to one too slowly. These types of transition faults often manifest themselves as defectively slow performance, such as where a device is supposed to run at 55 Mhz but only runs at 40 Mhz.

Referring still to FIG. 6, in accordance with the present embodiment, ATPG analysis 510 controls the fault site, in this case output 706, to cause a transition at the fault site and then observes the transitioning value at a measurable point. Creating the necessary transition at the fault site involves searching for the solution by traversing the overall netlist simulation 502.

Contrasting the test generation solution to that of stuck-at faults (infinite delay transition faults), the path along which the fault is detected does not matter. However, the path along which transition faults are detected has a significant impact on test quality. The shorter paths of the design have a larger "slack" compared to the slack on the longer paths. It takes a much bigger timing defect (e.g., a much larger slow-to-rise Δ 730) to impact the quality of the IC when tested along a short path as opposed to being tested along the long path. Thus, test and product quality is directly related to the slack of the circuit paths along which the faults are detected. For efficiency, prior art test pattern generators work in a time independent environment that renders the incorporation of high quality timing sensitive transition fault testing with stuck-at fault testing very difficult. In contrast, test pattern generation and fault simulation in accordance with the present invention is parameterized and quantified with respect to time and with respect to circuit paths along which the faults are detected. This aspect of the present invention makes transition fault testing practical.

Figure 7:
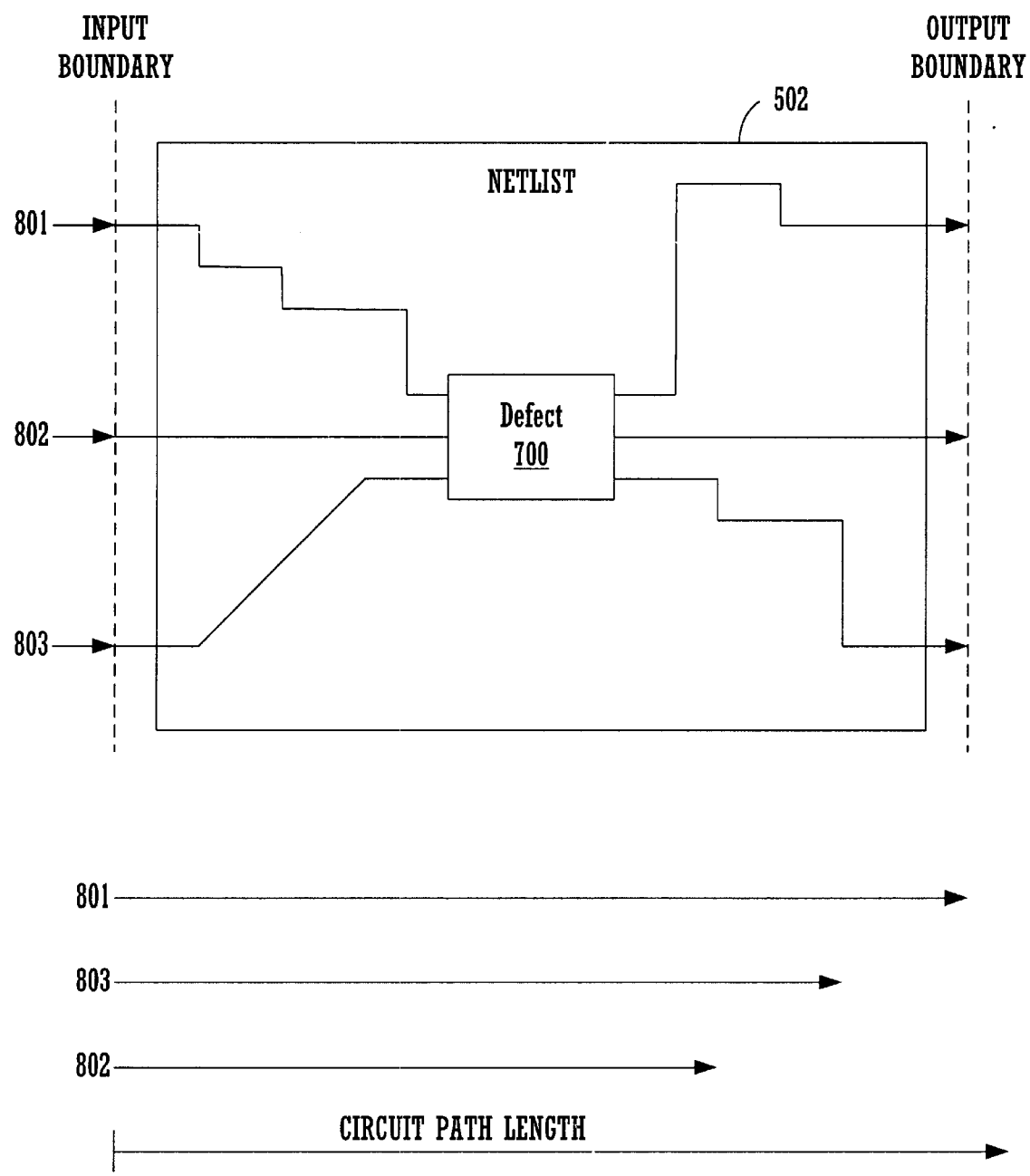
FIG. 7 shows a diagram of a netlist and fault including circuit paths passing through the fault as implemented in one embodiment of a present invention.

Referring now to FIG. 7, a diagram of netlist simulation 502 and fault 700 with circuit paths 801–803 is shown. As depicted in FIG. 7, netlist simulation 502 includes netlist portion 700 from FIG. 6. Three circuit paths are shown, each passing through the defect fault site of netlist portion 700, hereafter referred to simply as defect 700. As described above, numerous circuit paths passing through defect 700 are possible. In each case, a circuit path begins at the input boundary shown on the left side of FIG. 7 and ends at the output boundary shown on the right site of FIG. 7. The circuit paths take different routes through netlist simulation 502 to reach defect 700. Paths 801–803 are shown passing through defect 700 within netlist simulation 502 and are also shown with respect to a circuit path length representation 810 depicted in a legend beneath netlist simulation 502. Path 801 shows a longer circuit path, path 803 shows an intermediate length circuit path, and path 802 shows a shorter circuit path.

As described above, in the present embodiment, transition fault ATPG analysis is performed along long circuit paths (e.g., circuit path 801) to yield higher quality test vectors. With respect transition faults, the shortest path 802 is the worst for quality because it has the most slack with respect to the other paths in the device. The device does not reach its quiescent state until the signals have propagated through the longest paths (e.g., 801 and 803). The longest path is typically the critical path. In accordance with present invention, the best path for testing the transition fault is this critical path as it is sensitive to the smallest delay defect. Tests for long paths are created by configuring the underlying guidance mechanism of automatic test pattern generator analysis 510 to use the longest available paths through the fault site. The present invention uses level information of the netlist to guide the selection of the longest available circuit =path. The level information is obtained by leveling the combinational logic portion of the netlist from inputs to outputs and vice versa.

Figure 8:
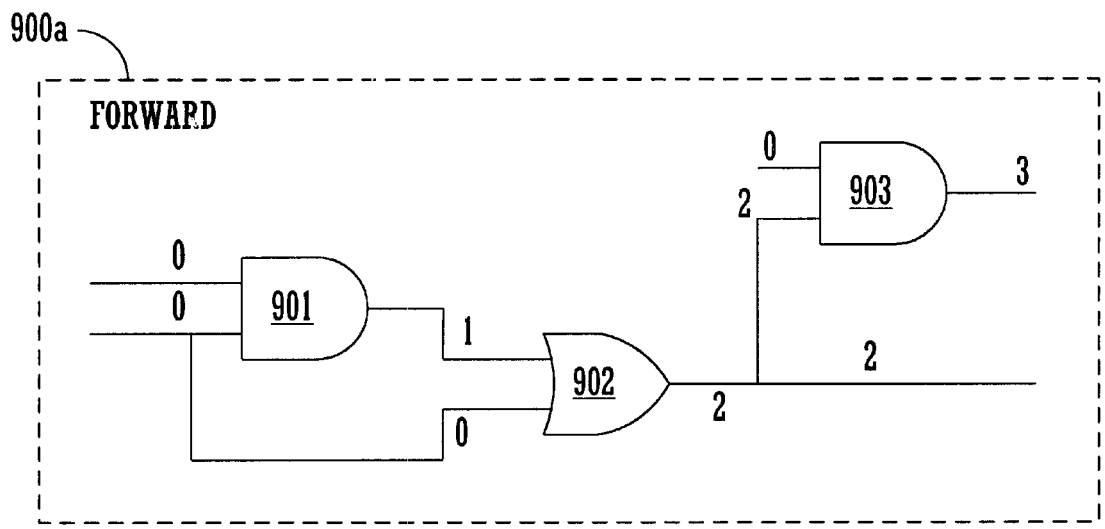
FIG. 8 shows a forward leveled netlist portion in accordance with one embodiment of the present invention.

Referring now to FIG. 8, a forward leveled netlist combinational portion 900a is shown. Netlist portion 900a, as with netlist portion 700 of FIG. 6, is a sub-portion of the overall netlist simulation 502 of FIG. 4. Netlist portion 900a shows gates 901–903 and their respective inputs and outputs. In this case, netlist portion 900a is leveled forward, wherein the maximum of fan in is plus 1 (e.g., the level increases plus 1 with the traversal of each gate). This is shown by the level numbers depicted above each of the respective inputs and outputs of gates 901–903.

Figure 9:
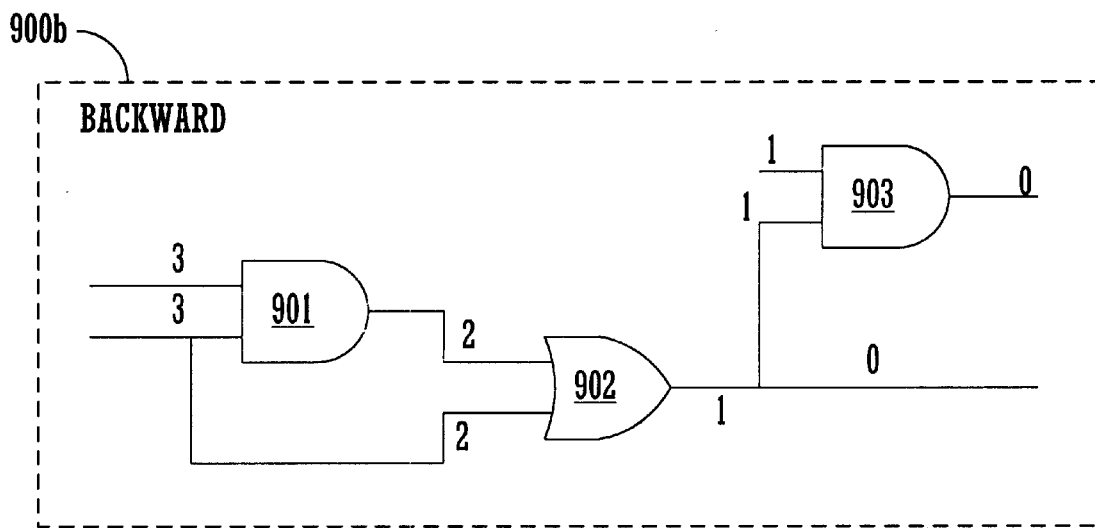
FIG. 9 shows a backward leveled netlist portion in accordance with one embodiment of the present invention.

FIG. 9 shows a backward leveled netlist portion 900b. In this case, netlist portion 900b is leveled backward, wherein the maximum of fan out is plus 1. This is shown by the level numbers depicted above each of the respective inputs and outputs of gates 901–903.

Figure 10:
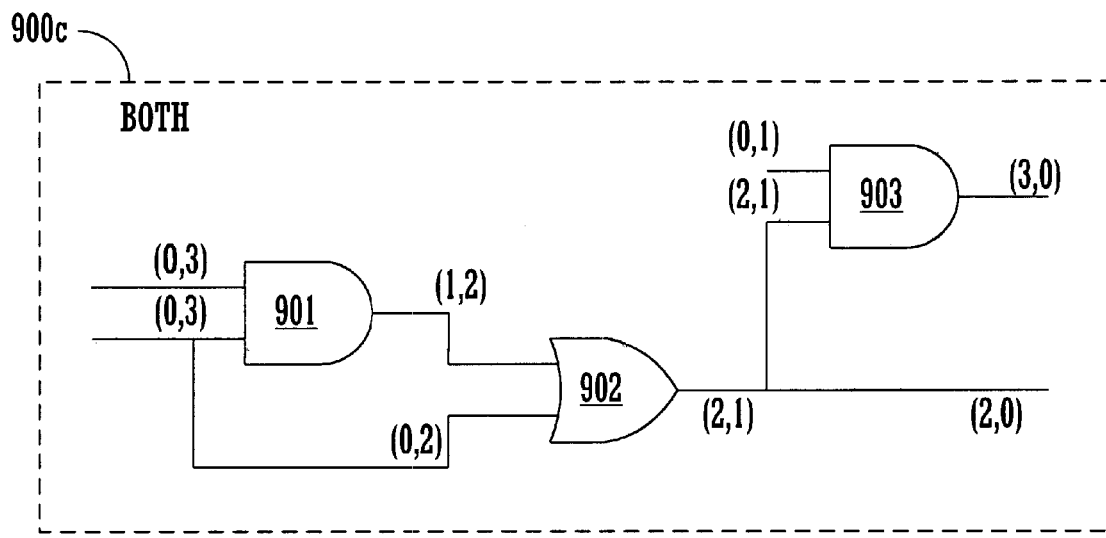
FIG. 10 shows a netlist portion having both forward leveled information and backward leveled information in accordance with one embodiment of the present invention.

FIG. 10 shows a netlist portion 900c with information from both forward levelization and backward levelization. In this case, the netlist portion 900c includes both the forward level number and the backward level number above each of the respective inputs and outputs of gates 901–903.

In accordance with present embodiment, to determine the longest available circuit path, the design (e.g., netlist portion 900c) is leveled both forward and backwards and the resulting level information (e.g. as shown in FIG. 10) is used by the automatic test program generation analysis 510 to guide testing toward the longer circuit path as defined by the level information. As described above, at numerous times during the ATPG process, the analysis program 510 selects among a number of circuit path choices. First it is important to quantify the range of paths in which the transition fault can be detected. During the forward levelization, a minimum and maximum path length is recorded and propagated. Consequently, every node in the netlist would have a tuple (minimum distance from a PI/state element, maximum distance from a PI/state element) as shown in netlist portion 900. Similarly, when the reverse levelization is performed, a tuple defining the minimum distance to an output/state element and maximum distance to an output/state element is recorded. As a result of this analysis, every fault has a minimum and maximum circuit path length associated with it. As described above, the longest forward and backward circuit path through the fault site is likely the critical path, or the path with the least slack, and thus, is the best circuit path on which to transition fault test. Note these values along the path can be levels or can be the actual time from path delay calculations, such as from a timing analyzer.

As a result of this analysis, every fault within the netlist has a minimum and maximum circuit path length associated with it. This information is available for the ATPG process 510. Using this information in a parameterized form, the number of levels from the maximum circuit path are used by ATPG process 510 to generate a test and then this information is used by fault simulation (also part of 510) to "give credit" for detecting faults.

For example, in typical operation, ATPG process 510 first uses the longest circuit path to generate a test vector for a particular fault. Second, the test for that fault is simulated (fault simulation). In addition to the fault that the test vector is generated for, the test vector may randomly (e.g., fortuitously) detect other transition faults. It is important that these faults be detected along long paths. As described above, ATPG process 510 is provided with information describing the levels of the netlist. Thus for every fault, the fault simulator knows the length of the longest path, and credit for detecting the faults is given in relation to the longest path associated with the fault.

Thus, for every "fortuitous detection," the circuit path length that fault simulation detected the fault on is measured and compared to the longest circuit path for the particular fault. If the measured circuit path equals the longest circuit path (e.g., "measured circuit path" equals a variable "longest circuit path") then the fault is considered as being detected (e.g., credited). If not, the fault is not considered as detected and analysis continues.

For efficiency reasons, several modifier variables are included with the variable "longest circuit path." For example, modifier variables can be minus one, minus two, minus three, etc. Measured circuit path length minus one gives credit for the longest two circuit paths. Measured circuit path length minus two gives credit for the longest three circuit paths. Similarly, measured circuit path length minus three gives credit for the longest four circuit paths. In this manner, the modifier variable adjusts the threshold for fault detection to make the process proceed more efficiently. The process is shown in the flow chart of FIG. 11A and FIG. 11B.

Figure 11B:
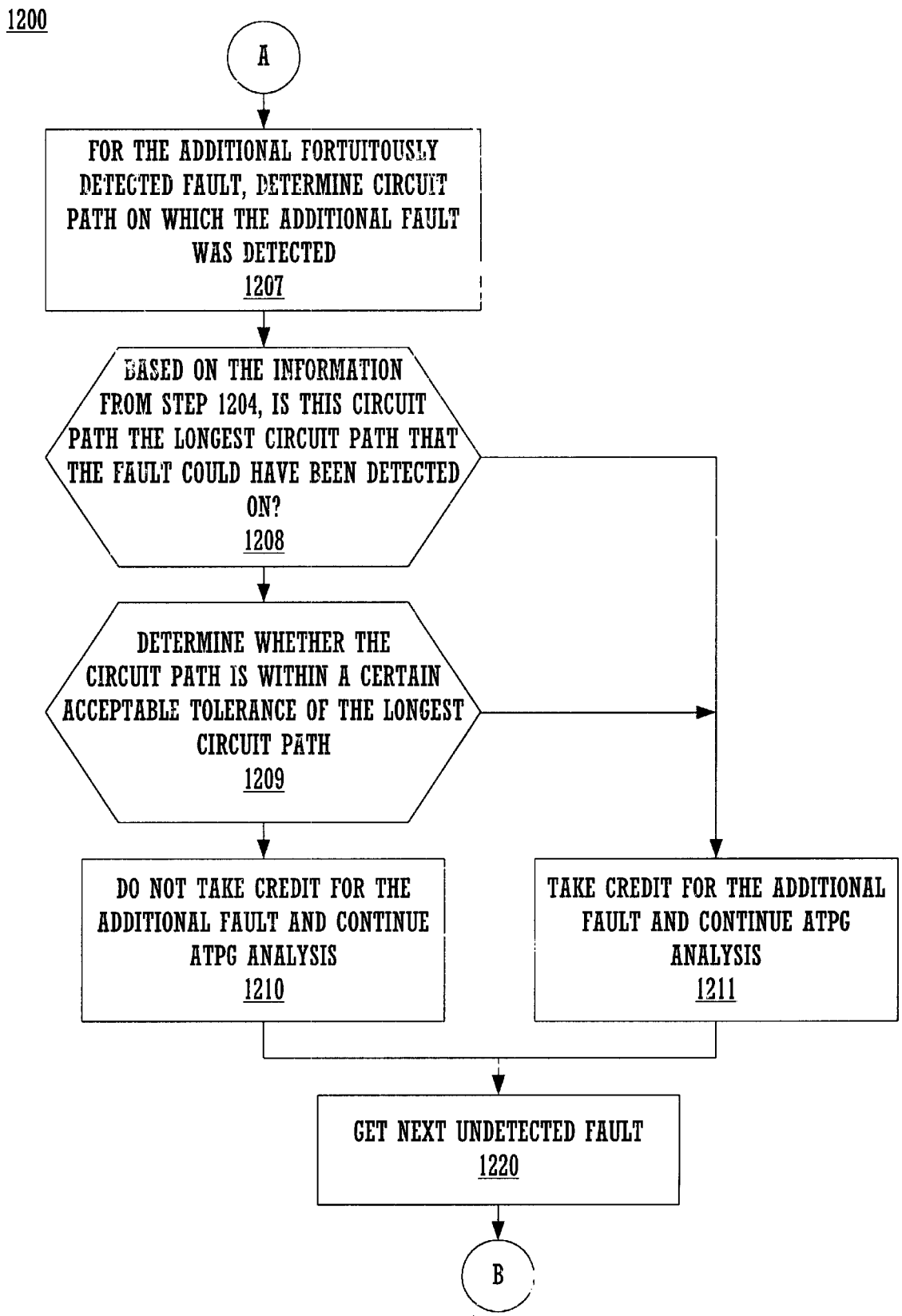
FIG. 11B shows more steps of the flow chart of the ATPG process from FIG. 11A.

Referring now to FIG. 11A and FIG. 11B, a flow chart of the steps of an ATPG process 1200 in accordance with one embodiment of the present invention is shown. FIG. 11A shows a first portion of process 1200 and FIG. 11B shows a second portion of process 1200. The steps of process 1200 depict the steps of an ATPG process (ATPG analysis 510 of FIG. 4) of determining test vectors for faults within a netlist.

Process 1200 begins in step 1201, where a netlist for an integrated circuit device (e.g., netlist simulation 502 of FIG. 4) is stored within the memory of a CAD workstation (e.g., workstation 412 of FIG. 3). As described above, the netlist models the functionality and structure of an integrated circuit device (e.g., a selected portion of IC device 530).

In steps 1202 and 1203, the ATPG program (e.g., ATPG analysis 510) determines the longest circuit paths for each fault. In step 1202, ATPG performs forward levelization to quantify the fan out delay of the circuit paths of the netlist. As described above, levelization is performed to characterize the delay of the particular paths within the netlist, wherein more paths equate to longer delay. In step 1203, backward levelization is performed to quantify the fan in delay for the particular circuit paths of the netlist. Thus, in step 1204, the resulting fan in delay and fan out delay information (e.g., level information) for all the circuit paths within the netlist is stored within the memory of the workstation such that the delay information is available for subsequent ATPG and fault simulation steps. The result stored at step 1204 is a record of the longest path through each fault and this is recorded for all faults of the netlist 502.

Referring still to process 1200 of FIG. 11A, in step 1205, using ATPG, a test vector for an initial fault (e.g., a first fault) is determined using the longest feasible circuit path that passes through that fault site. This test vector is output from the ATPG program and saved. Then, in step 1206, the detection status of additional faults is determined by fault simulating the test vector for the first, or "initial", fault. The test vector is applied to the longest path that traverses through the first fault. As described above, as the test vector for the first fault is fault simulated, numerous other faults are detected by chance.

Referring now to FIG. 11B, in step 1207, for the additional faults detected fortuitously, the circuit path on which an additional fault was detected is determined. In step 1208, the ATPG program determines whether the circuit path on which the additional fault was detected matches the longest circuit path for that additional fault. This determination is based on the longest circuit path information stored in step 1204. If the circuit path is the longest circuit path for that additional fault, process 1200 proceeds to step 1211, where credit for the additional fault is taken for the test vector and the resulting test vector is output from the ATPG program and stored. As described above, transition fault testing on the longest circuit path yields the highest quality test vector, so only detection along the longest path is used to record the additional fault.

Referring still to FIG. 11B, in step 1209, where the circuit path for the additional fault does not match the longest path for that fault, the ATPG program determines whether the circuit path is within a certain acceptable tolerance of the longest circuit path. As described above, in the present embodiment, a modifier variable can be used to give credit for circuit path lengths which are long, but not the longest, circuit path through the additional fault site. The modifier variable is adjustable, such that the user can vary the threshold of fault detection in accordance with any particular requirements (e.g., processing time, workstation memory, cost, etc.).

Consequently, if the circuit path for the additional fault is within the acceptable length tolerance, credit for the fault is taken for the test vector at step 1211 and ATPG continues at 1200 for the remaining faults in the netlist. However, in step 1210, if the circuit path for the additional fault is not within the acceptable tolerance, credit is not taken, and ATPG continues at 1220 to get the next undetected fault. It should be appreciated that the steps shown in FIG. 11B are performed for each additional fault detected for the initial fault. In this manner, process 1200 ensures that ATPG processing continues until high quality test vectors are obtained for all faults in the netlist.

Thus, the present invention provides a method and system for performing transition fault simulation along long circuit paths for high-quality ATPG. The present invention provides an ATPG process optimized to use transition fault testing on long circuit paths to generate higher quality test vectors than the prior art.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order best to explain the principles of the invention and its practical application, thereby to enable others skilled in the art best to utilize the invention and various embodiments with various modifications as are suited to the particular use contemplated. It is intended that the scope of the invention be defined by the Claims appended hereto and their equivalents.

What is claimed is:

1. A computer implemented method of generating test vectors for testing an integrated circuit device, the method comprising the steps of:
   a) determining a respective longest path through each fault of a plurality of faults identified within a netlist description of the integrated circuit device;
   b) determining a test vector for a first fault of the plurality of faults using an automatic test pattern generation (ATPG)process;
   c) performing transition fault simulation on the first fault by applying the test vector to a first path through the first fault, wherein the first path is the longest path traversing through the first fault as determined by "step a)";
   d) responsive to the transition fault simulation of "step c)", identifying a second fault that is fortuitously detected by the test vector as applied to a second path traversing through the second fault;
   e) crediting the test vector with detecting the first fault; and
   f) crediting the test vector with detecting the second fault provided the second path is the longest path that traverses through the second fault as determined by "step a)".

2. The method of claim 1 further comprising the step of repeating "step b)" through "step f)" for each undetected fault within the netlist description of the integrated circuit device.

3. The method of claim 1 further comprising the step of applying the test vector to the integrated circuit device using automatic test equipment.

4. The method of claim 2 wherein "step a)" comprises the step of performing a forward levelization for each fault of the plurality of faults.

5. The method of claim 2 wherein "step a)" comprises the step of performing a reverse levelization for each fault of the plurality of faults.

6. The method of claim 5 wherein "step a)" further comprises a step of performing a forward levelization for each fault of the plurality of faults.

7. A computer system comprising a processor coupled to a bus and a memory coupled to the bus wherein the memory contains instructions stored therein that when executed by the processor implement a method of generating test vectors for testing an integrated circuit device, the method comprising the steps of:
  a) determining a respective longest path through each fault of a plurality of faults identified within a netlist description of the integrated circuit device;
  b) determining a test vector for a first fault of the plurality of faults using an ATPG (automatic test pattern generation) process;
  c) performing transition fault simulation on the first fault by applying the test vector to a first path through the first fault, wherein the first path is the longest path traversing through the first fault as determined by "step a)";
  d) responsive to the transition fault simulation of "step c)", identifying a second fault that is fortuitously detected by the test vector as applied to a second path traversing through the second fault;
  e) crediting the test vector with detecting the first fault; and
  f) crediting the test vector with detecting the second fault provided the second path is the longest path that traverses through the second fault as determined by "step a)".

8. A computer system as described in claim 7, wherein the method further comprises the step of repeating "step b)" through "step f)" for each undetected fault within the netlist description of the integrated circuit device.

9. A computer system as described in claim 7 wherein "step a)" comprises the step of performing a forward levelization through the netlist description to determine the longest paths that traverse through the plurality of faults.

10. A computer system as described in claim 7 wherein "step a)" comprises the step of performing a reverse levelization through the netlist description to determine the longest paths that traverse through the plurality of faults.

11. A computer system as described in claim 10 wherein i"step a)" further comprises the step of performing a forward levelization through the netlist description to determine the longest paths that traverse through the plurality of faults.

12. A computer system as described in claim 7 wherein "step a)" comprises the step of performing timing analysis on the netlist description to determine the longest path that traverses through the plurality of faults.

13. A computer system as described in claim 7 wherein "step a)" is performed by using timing information from a timing analysis program to characterize a time delay for each of the paths through the plurality of faults.

14. A computer system as described in claim 7, further including the steps of using the test vector with automated testing equipment to test the integrated circuit device.

15. A computer system as described in claim 7, further including the steps of:
  determining an acceptable path tolerance for the longest path for the second fault; and
  crediting the test vector with detecting the second fault provided the second path is within the acceptable path tolerance.

* * * * *